United States Patent
Watanabe et al.

(10) Patent No.: US 7,435,535 B2
(45) Date of Patent: *Oct. 14, 2008

(54) METHOD FOR FORMING PATTERNED INSULATING ELEMENTS AND METHODS FOR MAKING ELECTRON SOURCE AND IMAGE DISPLAY DEVICE

(75) Inventors: Yasuyuki Watanabe, Tokyo (JP); Kazuya Ishiwata, Kanagawa (JP); Yoshimi Uda, Kanagawa (JP); Shinsaku Kubo, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 141 days.

This patent is subject to a terminal disclaimer.

(21) Appl. No.: 11/415,071

(22) Filed: May 2, 2006

(65) Prior Publication Data

US 2006/0194156 A1 Aug. 31, 2006

Related U.S. Application Data

(62) Division of application No. 10/913,331, filed on Aug. 9, 2004, now Pat. No. 7,318,996, which is a division of application No. 10/235,757, filed on Sep. 6, 2002, now Pat. No. 6,866,989.

(30) Foreign Application Priority Data

Sep. 7, 2001 (JP) .............................. 2001-271184

(51) Int. Cl.
*G03F 7/26* (2006.01)

(52) U.S. Cl. .................. 430/311; 430/394; 430/396
(58) Field of Classification Search .................. 430/5, 430/311, 394, 396
See application file for complete search history.

(56) References Cited

U.S. PATENT DOCUMENTS

| | | | |
|---|---|---|---|
| 6,183,669 B1 | 2/2001 | Kubota et al. | 252/518.1 |
| 6,653,232 B2 | 11/2003 | Uda et al. | 438/669 |
| 6,758,712 B2 | 7/2004 | Kubo et al. | 445/24 |
| 6,866,989 B2 * | 3/2005 | Watanabe et al. | 430/394 |
| 2002/0094494 A1 | 7/2002 | Chung et al. | 430/311 |
| 2003/0049572 A1 | 3/2003 | Watanabe et al. | 430/394 |

FOREIGN PATENT DOCUMENTS

JP 6-40472 5/1994

* cited by examiner

*Primary Examiner*—Kathleen Duda
(74) *Attorney, Agent, or Firm*—Fitzpatrick, Cella, Harper & Scinto

(57) ABSTRACT

A method for forming patterned insulating elements on a substrate includes a plurality of exposure steps of exposing a photosensitive paste provided on the substrate through at least one mask having a predetermined pattern; a developing step of developing the exposed photosensitive paste to form a precursor pattern; and a firing step of firing the precursor pattern to form the patterned insulating elements. This method is applied to a method for forming an electron source and a method for forming an image display device including the electron source.

2 Claims, 9 Drawing Sheets

DEPOSITION → (DRYING) → EXPOSITION → DEPOSITION → (DRYING) → EXPOSITION → DEPOSITION → (DRYING) → EXPOSITION → DEVELOPMENT → BAKING

METHOD FOR FORMING PATTERNED INSULATING ELEMENTS AND METHODS FOR MAKING ELECTRON SOURCE AND IMAGE DISPLAY DEVICE

This application is a division of application Ser. No. 10/913,331 filed Aug. 9, 2004, which is a division of application Ser. No. 10/235,757, filed Sep. 6, 2002.

BACKGROUND OF THE INVENTION

1. Field of the Invention

The present invention relates to a method forming patterned insulating elements using a photosensitive paste, and methods for making an electron source and an image display device according to the method for forming the patterned insulating elements.

2. Description of the Related Art

Large cathode ray tubes above 30 inches have recently appeared in the market; however, the depth and weight of the cathode ray tube increase with the size of the display screen. Furthermore, cathode ray tubes, which consume much electric power, do not meet demands for large display screens. Meanwhile, users want to watch strong visuals on larger screens. In order to satisfy such a requirement, development of thin and light planar image display devices for hanging on walls is expected as alternate devices of large and heavy cathode ray tubes.

Examples of planar image display devices are plasma display panels (PDPs) by luminescence of phosphors that excited by UV light, and cold cathode display panels by luminescence of phosphors that excited by electrons emerging from field emission (FE) electron emitter devices or surface conduction electron emitter (SCE) devices.

For example, for the formation of the cold cathode display panel, arrays of many electron emitting elements, column interconnections and row interconnections must be arranged. These arrays are formed by screen printing, which requires no vacuum chamber and can form large-area arrays with low cost. In screen printing, ink containing metal particles is applied by printing onto a substrate through a mask having a predetermined pattern, and is fired to form an interconnection pattern.

Japanese Patent Publication No. 6-40472 discloses a method for making a conductive thick-film interconnection substrate by depositing, exposing, developing, and firing a photosensitive paste.

SUMMARY OF THE INVENTION

An object of the present invention is to provide a method for forming precisely patterned insulating elements at target positions on a substrate.

Another object of the present invention is to provide methods for making an electron source having a high-precision element arrangement and an image display device capable of displaying high-definition images.

According to a first aspect of the present invention, a method for forming patterned insulating elements on a substrate includes a plurality of exposure steps of exposing a photosensitive paste provided on the substrate through at least one mask having a predetermined pattern; a developing step of developing the exposed photosensitive paste to form a precursor pattern; and a firing step of firing the precursor pattern to form the patterned insulating elements.

According to a second aspect of the present invention, a method for forming patterned insulating elements on a substrate includes a first exposure step of exposing a first photosensitive paste provided on the substrate through a first mask having a predetermined pattern; a second exposure step of exposing a second photosensitive paste provided on the first photosensitive paste through a second mask having a predetermined pattern; a developing step of developing the first photosensitive paste and the second photosensitive paste to form a precursor pattern; and a firing step of firing the precursor pattern to form the patterned insulating elements.

According to a third aspect of the present invention, in a method for making an electron source including a substrate, a plurality of first interconnections on the substrate, a plurality of second interconnections above the first interconnections, the first interconnections and the second interconnections being separated by patterned insulating elements and being orthogonal to each other, and a plurality of electron emitting elements connected into a matrix by the first interconnections and the second interconnections, the method includes a plurality of exposure steps of exposing a photosensitive paste provided on the substrate through at least one mask having a predetermined pattern; a developing step of developing the exposed photosensitive paste to form a precursor pattern; and a firing step of firing the precursor pattern to form the patterned insulating elements.

According to a fourth aspect of the present invention, in a method for making an electron source including a substrate, a plurality of first interconnections on the substrate, a plurality of second interconnections above the first interconnections, the first interconnections and the second interconnections being separated by patterned insulating elements and being orthogonal to each other, and a plurality of electron emitting elements connected into a matrix by the first interconnections and the second interconnections, the method includes a first exposure steps of exposing a first photosensitive paste provided on the substrate through a first mask having a predetermined pattern; a second exposure steps of exposing a second photosensitive paste provided on the first photosensitive paste through a second mask having a predetermined pattern; a developing step of developing the first photosensitive paste and the second photosensitive paste to form a precursor pattern; and a firing step of firing the precursor pattern to form the patterned insulating elements.

According to a fifth aspect of the present invention, in a method for making an image display device including an electron source and an image display component, the electron source including a substrate, a plurality of first interconnections on the substrate, a plurality of second interconnections above the first interconnections, the first interconnections and the second interconnections being separated by patterned insulating elements and being orthogonal to each other, and a plurality of electron emitting elements connected into a matrix by the first interconnections and the second interconnections, the image display component displaying an image by impingement of electrons that emerge from the electron source, the electron source is made by the method according to the fourth or fifth aspect.

Further objects, features and advantages of the present invention will become apparent from the following description of the preferred embodiments (with reference to the attached drawings).

DESCRIPTION OF THE PREFERRED EMBODIMENTS

Figure 1A:
FIGS. 1A to 1E are cross-sectional views of steps for forming a thick-film interconnection substrate (only insulating layer) according to EXAMPLE 1 of the present invention.

The first aspect of the present invention relates to a method for forming patterned insulating elements on a substrate. The method includes a plurality of exposure steps of exposing a photosensitive paste provided on the substrate through at least one mask having a predetermined pattern; a developing step of developing the exposed photosensitive paste to form a precursor pattern; and a firing step of firing the precursor pattern to form the patterned insulating elements.

In this aspect, these exposure steps are preferably performed using a plurality of masks having different patterns. Alternatively, in these exposure steps, the distances between the photosensitive paste and the mask are different from each other. In these exposure steps, the same regions of the photosensitive paste are exposed.

The second aspect of the present invention relates to a method for forming patterned insulating elements on a substrate. The method includes a first exposure step of exposing a first photosensitive paste provided on the substrate through a first mask having a predetermined pattern; a second exposure step of exposing a second photosensitive paste provided on the first photosensitive paste through a second mask having a predetermined pattern; a developing step of developing the first photosensitive paste and the second photosensitive paste to form a precursor pattern; and a firing step of firing the precursor pattern to form the patterned insulating elements.

In the second aspect, the first mask and the second mask preferably have different patterns. Preferably, the distance from the photosensitive paste to the first mask and distance from the photosensitive paste to the second mask are different.

In the first and second aspects, the patterned insulating elements includes (1) patterned insulating elements on a circuit substrate; (2) patterned barriers on a substrate of a display, for example, a plasma display; and (3) patterned insulating elements on a substrate provided with electron emitting elements or between a plurality of interconnections.

According to the first and second aspects, thick patterned insulating elements can be formed using a photosensitive insulating paste by sufficient exposure through only one firing step. The patterned insulating elements have no firing residue at their pattern edges. Since the shrinkage during firing is minimized, the resulting patterned insulating elements have high precision.

The third aspect of the present invention relates to a method for making an electron source including a substrate, a plurality of first interconnections on the substrate, a plurality of second interconnections above the first interconnections, the first interconnections and the second interconnections being separated by patterned insulating elements and being orthogonal to each other, and a plurality of electron emitting elements connected into a matrix by the first interconnections and the second interconnections. The method includes a plurality of exposure steps of exposing a photosensitive paste provided on the substrate through at least one mask having a predetermined pattern; a developing step of developing the exposed photosensitive paste to form a precursor pattern; and a firing step of firing the precursor pattern to form the patterned insulating elements.

In this aspect, these exposure steps are preferably performed using a plurality of masks having different patterns. Alternatively, in these exposure steps, the distances between the photosensitive paste and the mask are different from each other. In these exposure steps, the same regions of the photosensitive paste are exposed.

The fourth aspect of the present invention relates to a method for making an electron source including a substrate, a plurality of first interconnections on the substrate, a plurality of second interconnections above the first interconnections, the first interconnections and the second interconnections being separated by patterned insulating elements and being orthogonal to each other, and a plurality of electron emitting elements connected into a matrix by the first interconnections and the second interconnections. The method includes a first exposure steps of exposing a first photosensitive paste provided on the substrate through a first mask having a predetermined pattern; a second exposure steps of exposing a second photosensitive paste provided on the first photosensitive paste through a second mask having a predetermined pattern; a developing step of developing the first photosensitive paste and the second photosensitive paste to form a precursor pattern; and a firing step of firing the precursor pattern to form the patterned insulating elements.

In the fourth aspect, the first mask and the second mask preferably have different patterns. Preferably, the distance from the photosensitive paste to the first mask and distance from the photosensitive paste to the second mask are different.

The fifth aspect of the present invention relates to a method for making an image display device including an electron source and an image display component, the electron source including a substrate, a plurality of first interconnections on the substrate, a plurality of second interconnections above the first interconnections, the first interconnections and the second interconnections being separated by patterned insulating elements and being orthogonal to each other, and a plurality of electron emitting elements connected into a matrix by the first interconnections and the second interconnections, the image display component displaying an image by impingement of electrons that emerge from the electron source. The electron source is made by the method according to the fourth or fifth aspect.

According to the third to fifth aspects, thick patterned insulating elements can be formed using a photosensitive insulating paste by sufficient exposure through only one firing step. The patterned insulating elements have no firing residue at their pattern edges. Since the shrinkage during firing is minimized, the resulting patterned insulating elements have high precision.

A photosensitive insulating paste is applied on thick-film interconnections and is subjected to at least two exposure steps. Alternatively, a photosensitive insulating paste is applied and is subjected to a first exposure step, then the photosensitive insulating paste is applied to substantially the same position and is subjected to a second exposure step. That is, at least two deposition and exposure steps are performed. Next, the exposed insulating paste is developed. A patterned insulating layer is thereby formed.

The photosensitive insulating paste according to the present invention contains an organic photosensitive substance, glass frit, and a solvent.

In the deposition step, the photosensitive insulating paste is applied onto a substrate by any process, for example, a screen printing process or a coating process.

In the exposure step, a photomask with a predetermined pattern is disposed above the photosensitive insulating paste deposited on the substrate to expose the photosensitive insulating paste with UV light or the like. In general, the second or subsequent exposure step is performed such that substantially the same positions as those in the prior exposure step(s) are exposed. Of course, different positions may be exposed in the different exposure steps. A baking step for heating the photosensitive insulating paste may be employed before and/or after the exposure step After the exposure step or the deposition and exposure steps are repeated several times, a developing step is performed to form a desired pattern in the insulating layer. The patterned insulating layer is fired to form a thick interconnection substrate.

The line width of the second or subsequent exposure step may be the same or different from that of the prior exposure step. The line width of the second or subsequent exposure step may be wider or narrower than that of the prior exposure step. Furthermore, the distance between the photomask and the surface to be exposed may be the same or different in these exposure steps.

Conductive leads (upper interconnections) may be formed at required positions on the resulting thick interconnection substrate by any process, for example, a screen printing process that includes a plurality of cycles of printing, drying, and firing. The cycles are repeated until the thickness of the upper interconnections reaches a predetermined value.

The thick interconnection substrate according to the present invention can be suitably used as an electron source substrate of a planar image display device, in which an image is displayed by luminescence of a phosphor caused by accelerated electrons. The apparatus includes electron emitting elements and the phosphor FIG. 8 shows such as image display device. This apparatus is maintained at vacuum to discharge electrons into a space.

EXAMPLES

The present invention will now be described by non-limiting EXAMPLES.

Example 1

Figure 1B:
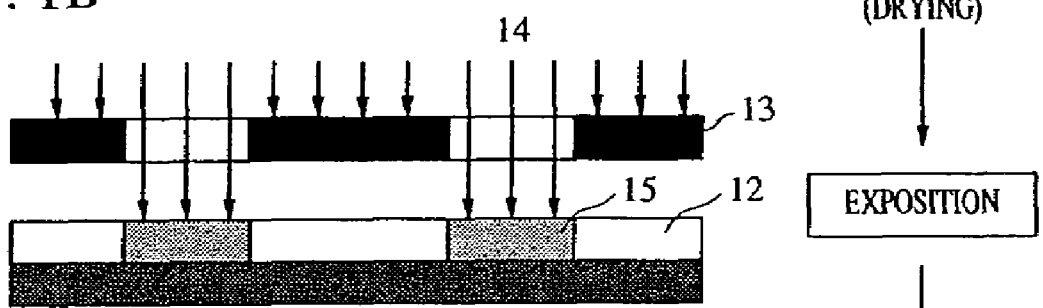
Figure 1C:
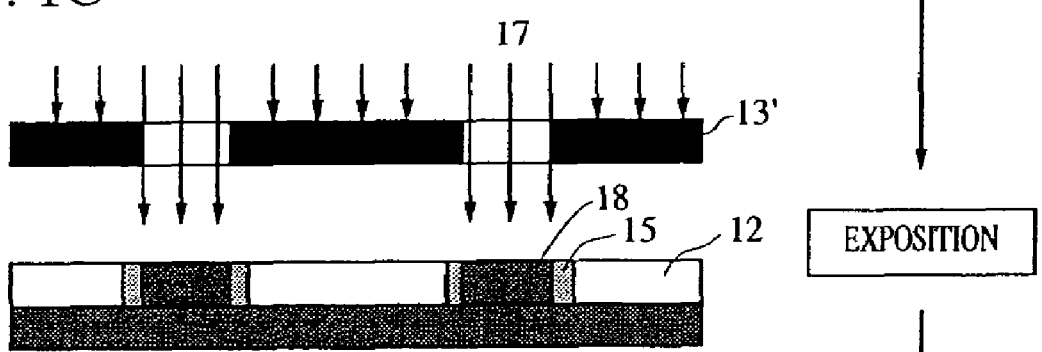
Figure 1D:
Figure 1E:

FIGS. 1A to 1E are cross-sectional views of steps for forming a thick-film interconnection substrate according to EXAMPLE 1 of the present invention; FIG. 1A shows a state after application of a photosensitive paste; FIG. 1B shows a state after first exposure; FIG. 1C shows a state after second exposure; FIG. 1D shows a state after development; and FIG. 1E shows a state after firing.

Referring to FIG. 1A, an insulating photosensitive paste 12 was deposited on a substrate 11 composed of lime glass by a screen printing process using a 200-mesh plate in order to form a dried thickness of about 12 μm. The mesh of the plate may be generally determined within the range of 150 to 400 meshes depending on the target thickness. The photosensitive paste used in this example contained glass frit, an organic photosensitive substance, and 20% to 40% solvent. The substrate was dried at about 80° C. to 150° C. The dried thickness of the photosensitive paste was about 13 μm.

Referring to FIG. 1B, a mask 13 having a predetermined opening pattern was disposed at a predetermined position, and the photosensitive paste 12 was exposed by exposure light 14 through the opening pattern. Latent images 15 were formed in the photosensitive paste 12.

Referring to FIG. 1C, another mask 13' having a smaller opening pattern was aligned so that the center of each opening in the mask 13 is the same as the center of each opening in the mask 13'. The photosensitive paste 12 was exposed by exposure light 17 through the opening pattern. Latent images 18 were formed in the photosensitive paste 12.

Referring to FIG. 1D, after the two exposure steps, the photosensitive paste 12 was developed with a weak alkaline solution, was washed with pure water, and was dried by blowing to form a developed pattern 19. The developing solution may be changed depending on the photosensitive paste used.

Referring to FIG. 1E, the photosensitive paste 12 was fired at about 500° C. to form an insulating layer pattern 20 with a thickness of about 7 μm. The shrinkage rate of the fired insulating layer pattern 20 to the developed pattern 19 was 5% or less. No firing residue was observed at pattern edges.

An insulating layer pattern without firing residue was thereby prepared by performing a plurality of exposure steps to a printed insulating photosensitive paste.

Comparative Example 1

Figure 2A:
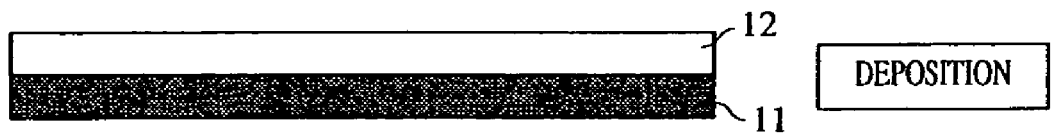
FIGS. 2A to 2D' are cross-sectional views of steps for forming a thick-film interconnection substrate (only insulating layer) according to a comparative example.
Figure 2B:
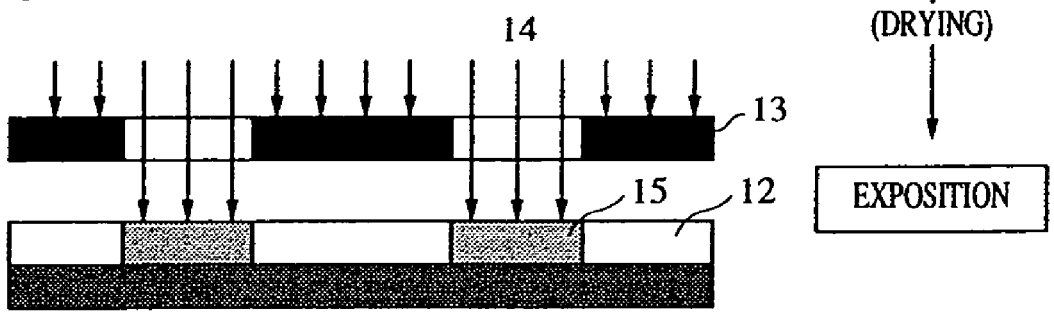
Figure 2C:
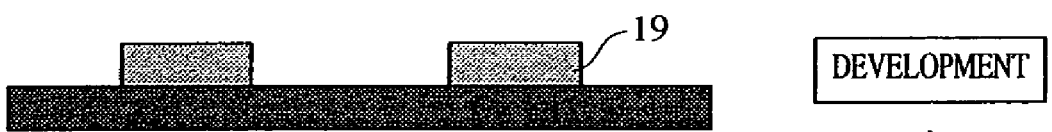
Figure 2D:
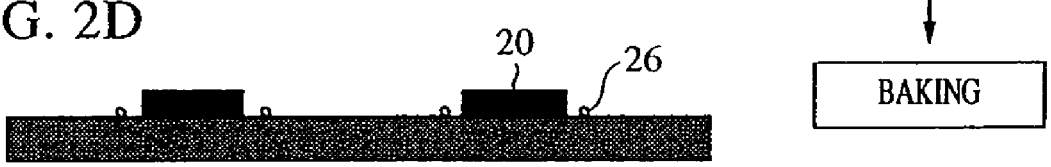
Figure 2D:
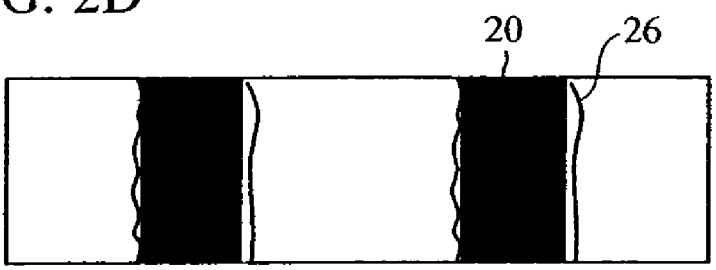

FIGS. 2A to 2D' are cross-sectional views of steps for forming a thick-film interconnection substrate according to COMPARATIVE EXAMPLE 1; FIG. 2A shows a state after application of a photosensitive paste; FIG. 2B shows a state after exposure; FIG. 2C shows a state after development; FIG. 2D shows a state after firing; and FIG. 2D' is a plan view after firing.

Referring to FIG. 2A, an insulating photosensitive paste 12 was deposited on a substrate 11 composed of lime glass by a screen printing process using a 200-mesh plate in order to form a dried thickness of about 12 μm. The mesh of the plate may be generally determined within the range of 150 to 400 meshes depending on the target thickness The photosensitive paste used in this example contained glass frit, an organic photosensitive substance, and 20% to 40% solvent. The substrate was dried at about 80° C. to 150° C. The dried thickness of the photosensitive paste was about 13 μm.

Referring to FIG. 2B, a mask 13 having a predetermined opening pattern was disposed at a predetermined position, and the photosensitive paste 12 was exposed by exposure light 14 through the opening pattern. Latent images 15 were formed in the photosensitive paste 12.

Referring to FIG. 2C, the photosensitive paste 12 was developed with a weak alkaline solution, was washed with pure water, and was dried by blowing to form a developed pattern 19. The developing solution may be changed depending on the photosensitive paste used.

Referring to FIG. 2D, the photosensitive paste 12 was fired at about 500° C. to form an insulating layer pattern 20 with a thickness of about 7 μm. The shrinkage rate of the fired insulating layer pattern 20 to the developed pattern 19 was about 20%. Firing residue 26 was observed at many pattern edges.

Example 2

Figure 3A:
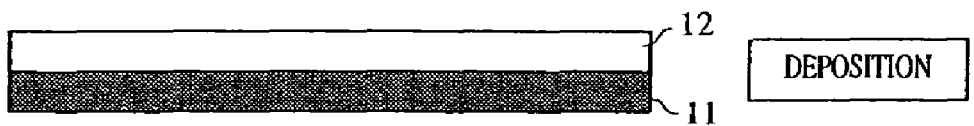
FIGS. 3A to 3F are cross-sectional views of steps for forming a thick-film interconnection substrate (only insulating layer) according to EXAMPLE 2 of the present invention.
Figure 3B:
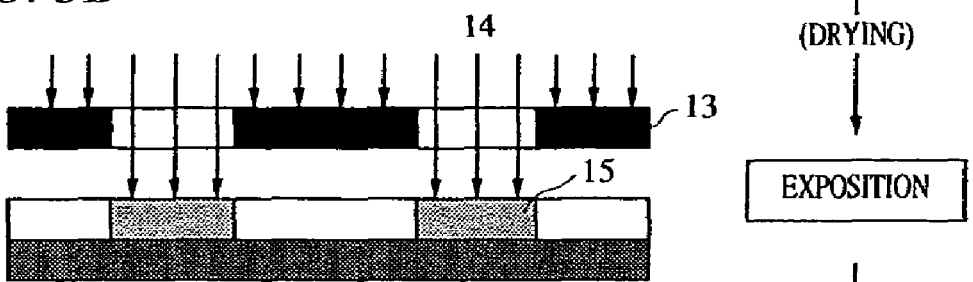
Figure 3C:
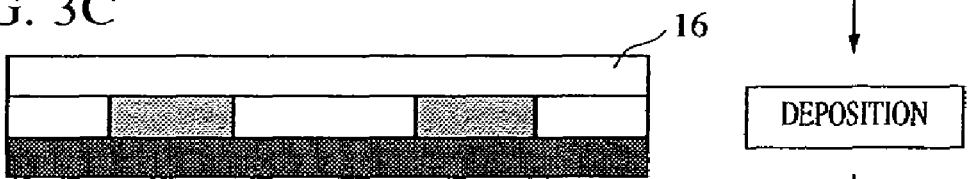
Figure 3D:
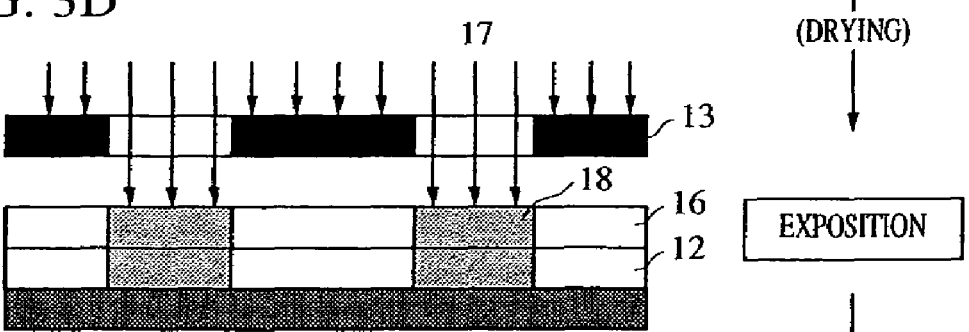
Figure 3E:
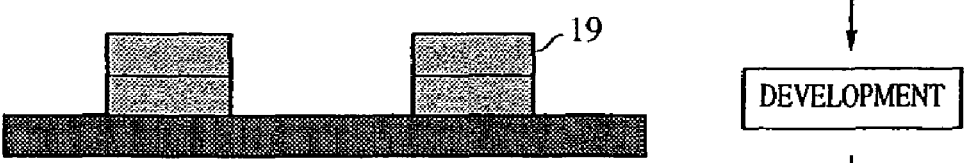
Figure 3F:

FIGS. 3A to 3F are cross-sectional views of steps for forming a thick-film interconnection substrate according to EXAMPLE 2 of the present invention; FIG. 3A shows a state after first layer deposition of a photosensitive paste; FIG. 3B shows a state after first layer exposure; FIG. 3C shows a state after second deposition of a photosensitive paste; FIG. 3D shows a state after second layer exposure; FIG. 3E shows a state after development; and FIG. 3F shows a state after firing.

Referring to FIG. 3A, an insulating photosensitive paste 12 was deposited on a substrate 11 composed of lime glass by a screen printing process using a 200-mesh plate in order to form a dried thickness of about 12 μm. The mesh of the plate may be generally determined within the range of 150 to 400 meshes depending on the target thickness. The photosensitive paste used in this example contained glass frit, an organic photosensitive substance, and 20% to 40% solvent. The substrate was dried at about 80° C. to 150° C. The dried thickness of the photosensitive paste was about 11 μm.

Referring to FIG. 3B, a mask 13 having a predetermined opening pattern was disposed at a predetermined position, and the photosensitive paste 12 was exposed by exposure light 14 through the opening pattern. Latent images 15 were formed in the photosensitive paste 12.

Referring to FIG. 3C, a second insulating photosensitive paste 16 was deposited on the first photosensitive paste 12 and was dried as in the first insulating photosensitive paste 12. The dried total thickness of the photosensitive paste was about 22 μm.

Referring to FIG. 3D, the same mask 13 was disposed so that the lower and upper photosensitive paste patterns were aligned. The photosensitive paste 16 was exposed by exposure light 17 through the opening pattern. Latent images 18 were formed in the photosensitive paste 16.

Referring to FIG. 3E, after the two deposition and exposure steps, the photosensitive pastes 12 and 16 were simultaneously developed with a weak alkaline solution, was washed with pure water, and was dried by blowing to form a developed pattern 19. The developing solution may be changed depending on the photosensitive paste used.

Referring to FIG. 3F, the developed pattern 19 was fired at about 500° C. to form an insulating layer pattern 20 with a minimum thickness of about 14 μm in the pattern center and a maximum thickness of about 17 to 18 μm at pattern edges. Thus, the edge curl was merely 1.1 to 1.2 times. Substantially, no firing residue was observed at pattern edges.

An insulating layer pattern with reduced edge curl and without firing residue was thereby prepared by repeating the deposition and exposure steps twice and simultaneously developing the two photosensitive paste layers.

Example 3

Figure 4A:
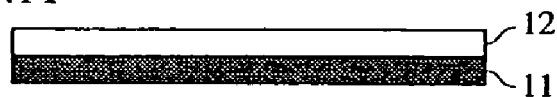
FIGS. 4A to 4H are cross-sectional views of steps for forming a thick-film interconnection substrate (only insulating layer) according to EXAMPLE 3 of the present invention.
Figure 4B:
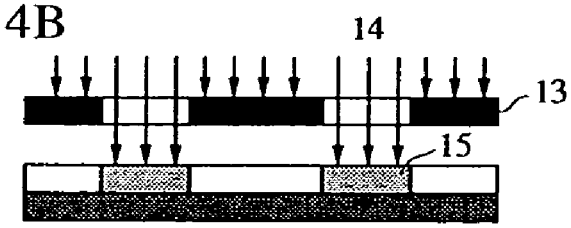
Figure 4C:
Figure 4D:
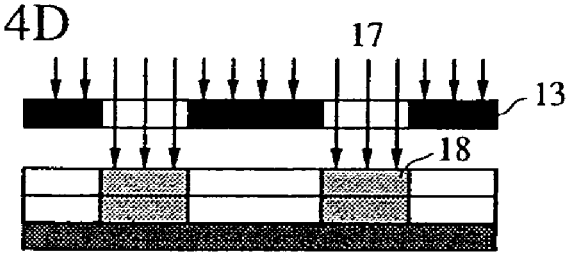
Figure 4E:
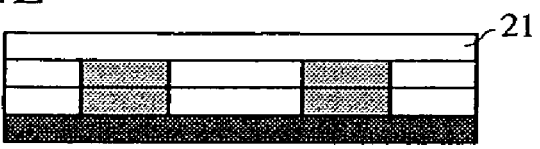
Figure 4F:
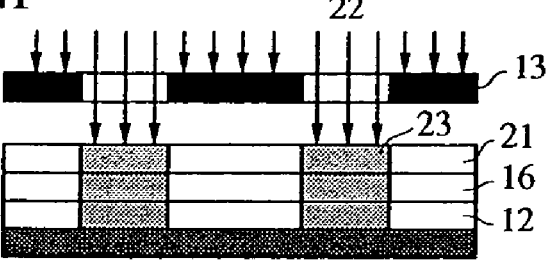
Figure 4G:
Figure 4H:

FIGS. 4A to 4H are cross-sectional views of steps for forming a thick-film interconnection substrate according to EXAMPLE 3 of the present invention; FIG. 4A shows a state after first layer deposition of a photosensitive paste; FIG. 4B shows a state after first layer exposure; FIG. 4C shows a state after second layer deposition of a photosensitive paste; FIG. 4D shows a state after second layer exposure; FIG. 4E shows a state after third layer deposition of a photosensitive paste; FIG. 4F shows a state after third layer exposure; FIG. 4G shows a state after development; and FIG. 4H shows a state after firing.

Referring to FIG. 4A, an insulating photosensitive paste 12 was deposited on a substrate 11 composed of lime glass by a screen printing process using a 400-mesh plate in order to form a dried thickness of about 7 μm. The mesh of the plate may be generally determined within the range of 150 to 400 meshes depending on the target thickness. The photosensitive paste used in this example contained glass frit, an organic photosensitive substance, and 20% to 40% solvent. The substrate was dried at about 80° C. to 150° C. The dried thickness of the photosensitive paste was about 8 μm.

Referring to FIG. 4B, a mask 13 having a predetermined opening pattern was disposed at a predetermined position, and the photosensitive paste 12 was exposed by exposure light 14 through the opening pattern. Latent images 15 were formed in the photosensitive paste 12.

Referring to FIG. 4C, a second insulating photosensitive paste 16 was deposited on the first photosensitive paste 12 and was dried as in the first insulating photosensitive paste 12. The dried total thickness of the photosensitive paste was about 15 μm.

Referring to FIG. 4D, the same mask 13 was disposed so that the lower and upper photosensitive paste patterns were aligned. The photosensitive paste 16 was exposed by exposure light 17 through the opening pattern. Latent images 18 were formed in the photosensitive paste 16.

Referring to FIG. 4E, a third insulating photosensitive paste 21 was deposited on the second photosensitive paste 16 and was dried as in the first insulating photosensitive paste 12. The dried total thickness of the photosensitive paste was about 22 μm.

Referring to FIG. 4F, the same mask 13 was disposed so that the three photosensitive paste patterns were aligned. The photosensitive paste 21 was exposed by exposure light 22 through the opening pattern. Latent images 23 were formed in the photosensitive paste 21.

Referring to FIG. 4G, after the three deposition and exposure steps, the photosensitive pastes 12, 16, and 21 were simultaneously developed as in EXAMPLE 2 to form a developed pattern 24.

Referring to FIG. 4H, the developed pattern 24 was fired at about 500° C. to form an insulating layer pattern 25 with a line width of about 75 μm and a minimum thickness of about 14 μm in the pattern center and a maximum thickness of about 15 to 17 μm at pattern edges. Thus, the edge curl was merely 1.1 to 1.2 times. Substantially, no firing residue was observed at pattern edges.

A thick insulating layer pattern with reduced edge curl and without firing residue was thereby prepared by repeating the deposition and exposure steps three times and simultaneously developing the three photosensitive paste layers.

Example 4

Figure 5A:
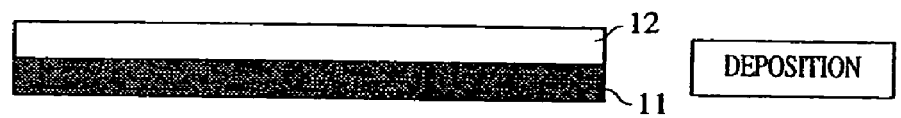
FIGS. 5A to 5F are cross-sectional views of steps for forming a thick-film interconnection substrate (only insulating layer) according to EXAMPLE 4 of the present invention.
Figure 5B:
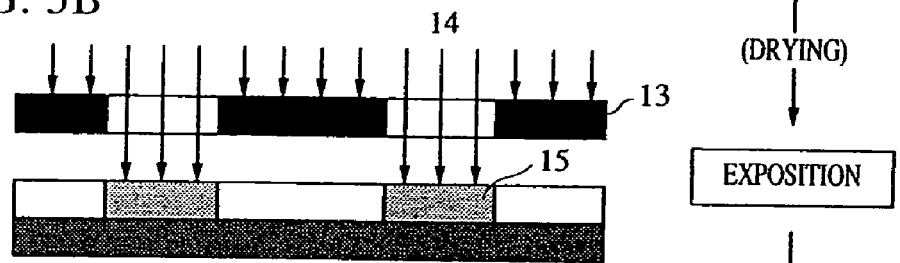
Figure 5C:
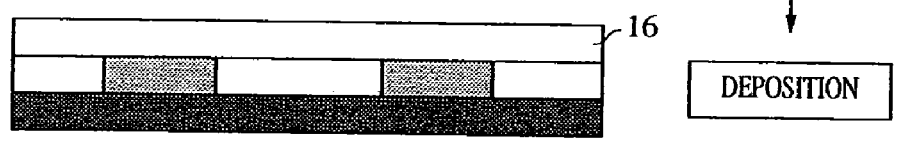
Figure 5D:
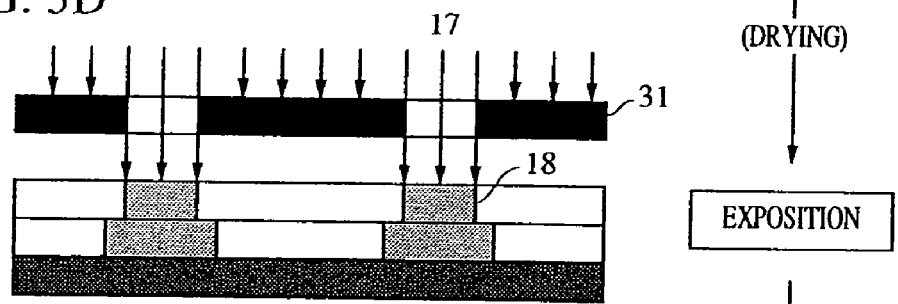
Figure 5E:
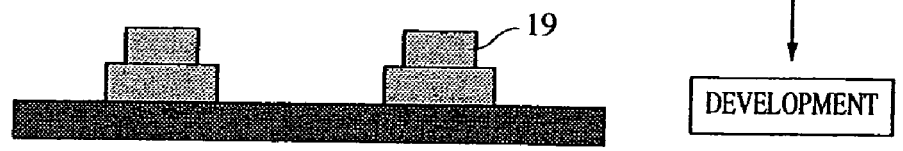
Figure 5F:

FIGS. 5A to 5F are cross-sectional views of steps for forming a thick-film interconnection substrate according to EXAMPLE 4 of the present invention; FIG. 5A shows a state after first layer deposition of a photosensitive paste; FIG. 5B shows a state after first layer exposure; FIG. 5C shows a state after second deposition of a photosensitive paste; FIG. 5D shows a state after second layer exposure; FIG. 5E shows a state after development; and FIG. 5F shows a state after firing. Parts having the same functions as in FIG. 3 are referred to with the same reference numerals, and a detailed description thereof with reference to drawings has been omitted.

In this example, different masks were used in the steps shown in FIGS. 5B and 5D. Specifically, the width of each opening in the mask 13 in FIG. 5B was wider than that in the mask 31 in FIG. 5D. Referring to FIG. 5E, a developed pattern 19 having different line widths in the vertical direction was prepared as in EXAMPLE 2.

Referring to FIG. 5F, the developed pattern 19 was fired at about 500° C. to form an insulating layer pattern 20 with a minimum thickness of about 14 μm in the pattern center and a maximum thickness of about 17 μm at pattern edges. Thus, the edge curl was merely 1.2 times. Substantially, no firing residue was observed at pattern edges.

An insulating layer pattern with reduced edge curl and without firing residue was thereby prepared by repeating the deposition and exposure steps twice and simultaneously developing the two photosensitive paste layers.

Example 5

Figure 6A:
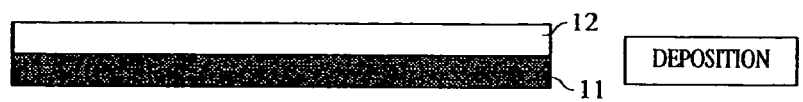
FIGS. 6A to 6F are cross-sectional views of steps for forming a thick-film interconnection substrate (only insulating layer) according to EXAMPLE 5 of the present invention.
Figure 6B:
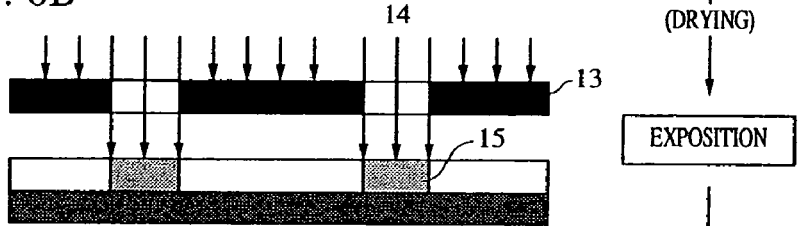
Figure 6C:
Figure 6D:
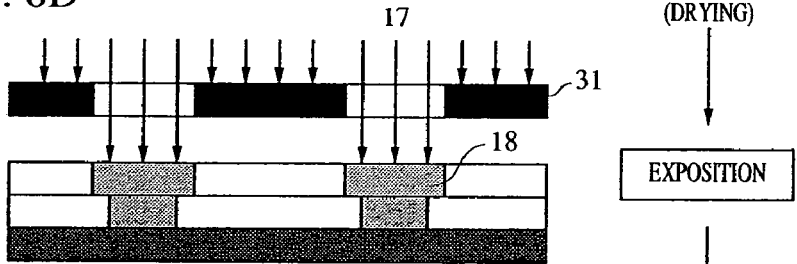
Figure 6E:
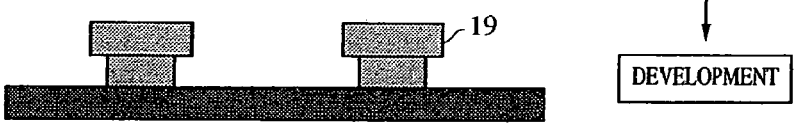
Figure 6F:
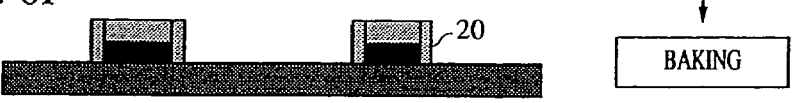

FIGS. 6A to 6F are cross-sectional views of steps for forming a thick-film interconnection substrate according to EXAMPLE 5 of the present invention; FIG. 6A shows a state after first layer deposition of a photosensitive paste; FIG. 6B shows a state after first layer exposure; FIG. 6C shows a state after second deposition of a photosensitive paste; FIG. 6D shows a state after second layer exposure; FIG. 6E shows a state after development; and FIG. 6F shows a state after firing. Parts having the same functions as in FIG. 3 are referred to with the same reference numerals, and a detailed description thereof with reference to drawings has been omitted.

In this example, different masks were used in the steps shown in FIGS. 6B and 6D. Specifically, the width of each opening in the mask 13 in FIG. 6B was narrower than that in the mask 31 in FIG. 6D. The softening point of the photosensitive paste 18 is lower than that of the photosensitive paste 16. Referring to FIG. 6E, a developed pattern 19 having different line widths in the vertical direction was prepared as in EXAMPLE 2.

Referring to FIG. 6F, the developed pattern 19 was fired at about 500° C. to form an insulating layer pattern 20 with a thickness of about 14 μm. The upper developed pattern 19 extended downward so as to cover the edges of the lower developed pattern 15. Thus, no void was substantially formed under the edge curl. Substantially, no firing residue was observed at pattern edges.

An insulating layer pattern with reduced voids under the edge curl and without firing residue was thereby prepared by repeating the deposition and exposure steps twice and simultaneously developing the two photosensitive paste layers. This shape is effective for preventing short-circuiting from sides to lower interconnections.

Example 6

Figure 7A:
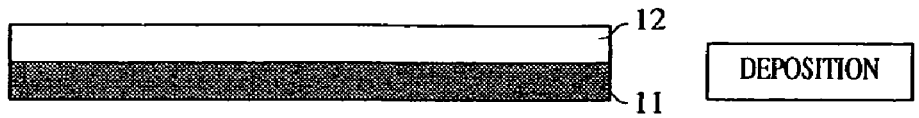
FIGS. 7A to 7F are cross-sectional views of steps for forming a thick-film interconnection substrate (only insulating layer) according to EXAMPLE 6 of the present invention.
Figure 7B:
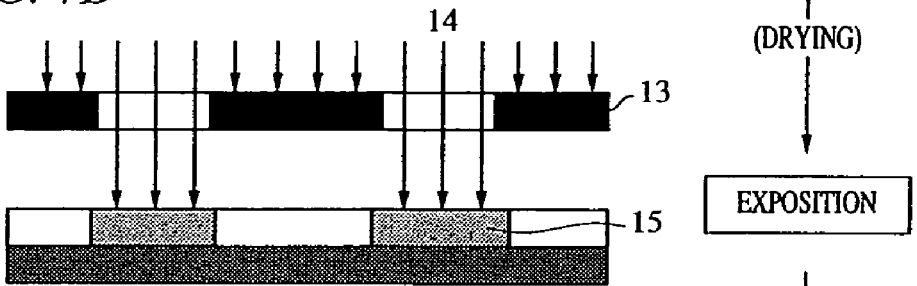
Figure 7C:
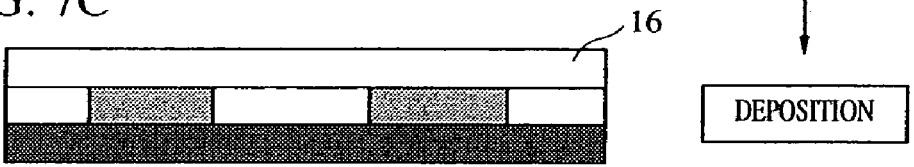
Figure 7D:
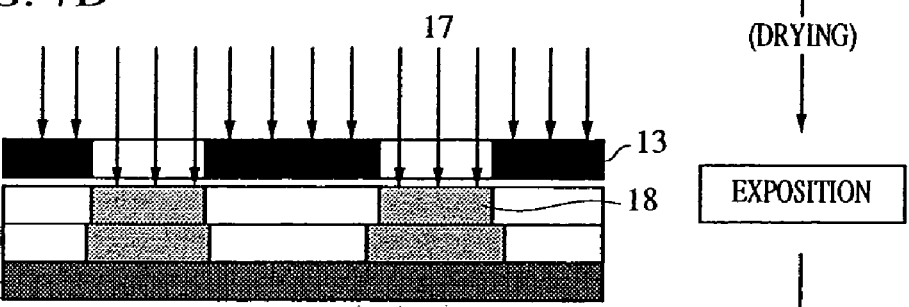
Figure 7E:
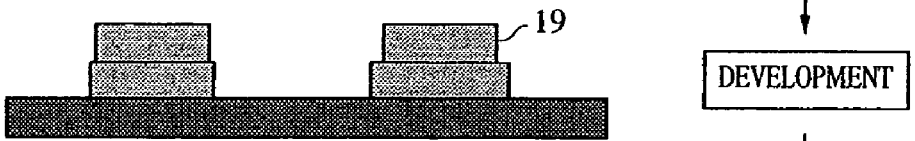
Figure 7F:
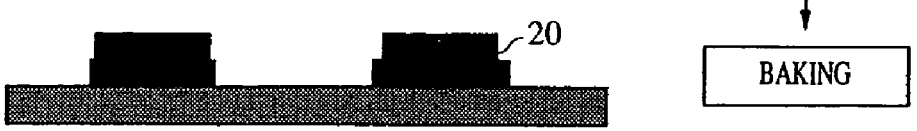

FIGS. 7A to 7F are cross-sectional views of steps for forming a thick-film interconnection substrate according to EXAMPLE 6 of the present invention; FIG. 7A shows a state after first layer deposition of a photosensitive paste; FIG. 7B shows a state after first layer exposure; FIG. 7C shows a state after second deposition of a photosensitive paste; FIG. 7D shows a state after second layer exposure; FIG. 7E shows a state after development; and FIG. 7F shows a state after firing. Parts having the same functions as in FIG. 3 are referred to with the same reference numerals, and a detailed description thereof with reference to drawings has been omitted.

In this example, the same mask was used in the steps shown in FIGS. 7B and 7D, but the distances between the mask and the photosensitive paste layer were different. Specifically, the distance in FIG. 7B was about 500 μm whereas that in FIG. 7D was about 100 μm. Referring to FIG. 7E, a developed pattern 19 having different line widths in the vertical direction was prepared as in EXAMPLE 2. The line width of the developed pattern was narrower at the upper portion than at the lower portion.

Referring to FIG. 7F, the developed pattern 19 was fired at about 500° C. to form an insulating layer pattern 20 with a minimum thickness of about 14 μm in the pattern center and a maximum thickness of about 17 μm at pattern edges. Thus, the edge curl was merely 1.2 times. The line width was 75 μm at the lower portion and 65 μm at the upper portion. Substantially, no firing residue was observed at pattern edges.

An insulating layer pattern with reduced edge curl and without firing residue was thereby prepared by repeating the deposition and exposure steps twice and simultaneously developing the two photosensitive paste layers.

According to this example, the line width of each layer can be changed using only one mask.

Example 7

Figure 8A:
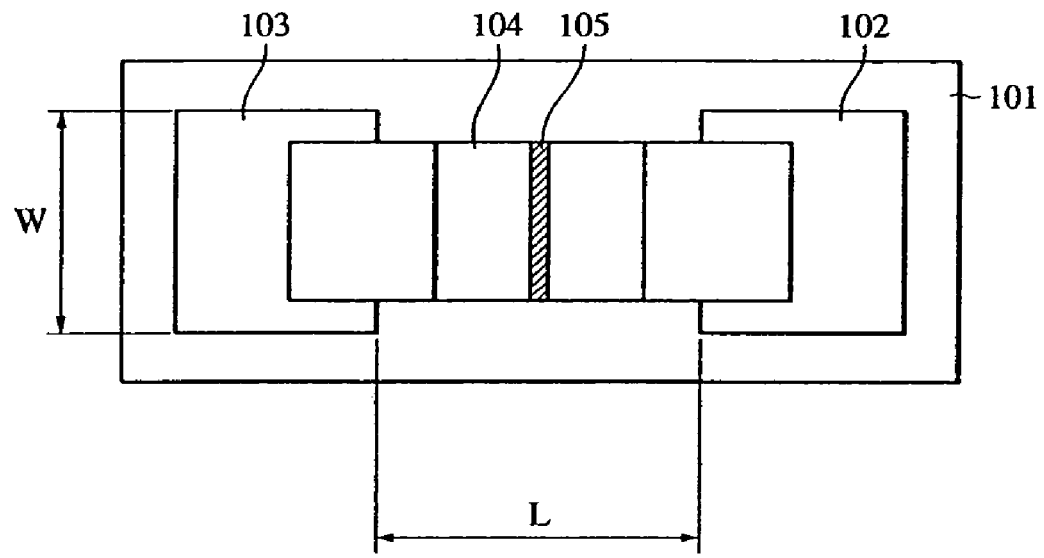
FIGS. 8A and 8B are a schematic plan view and cross-sectional view, respectively, of a surface conduction electron emitter device used in an electron source of the present invention.
Figure 8B:
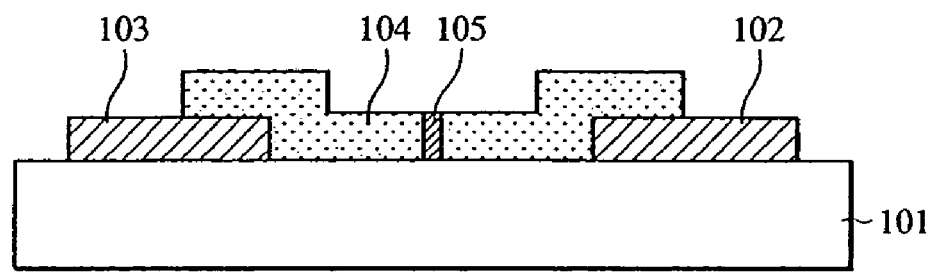
Figure 9:
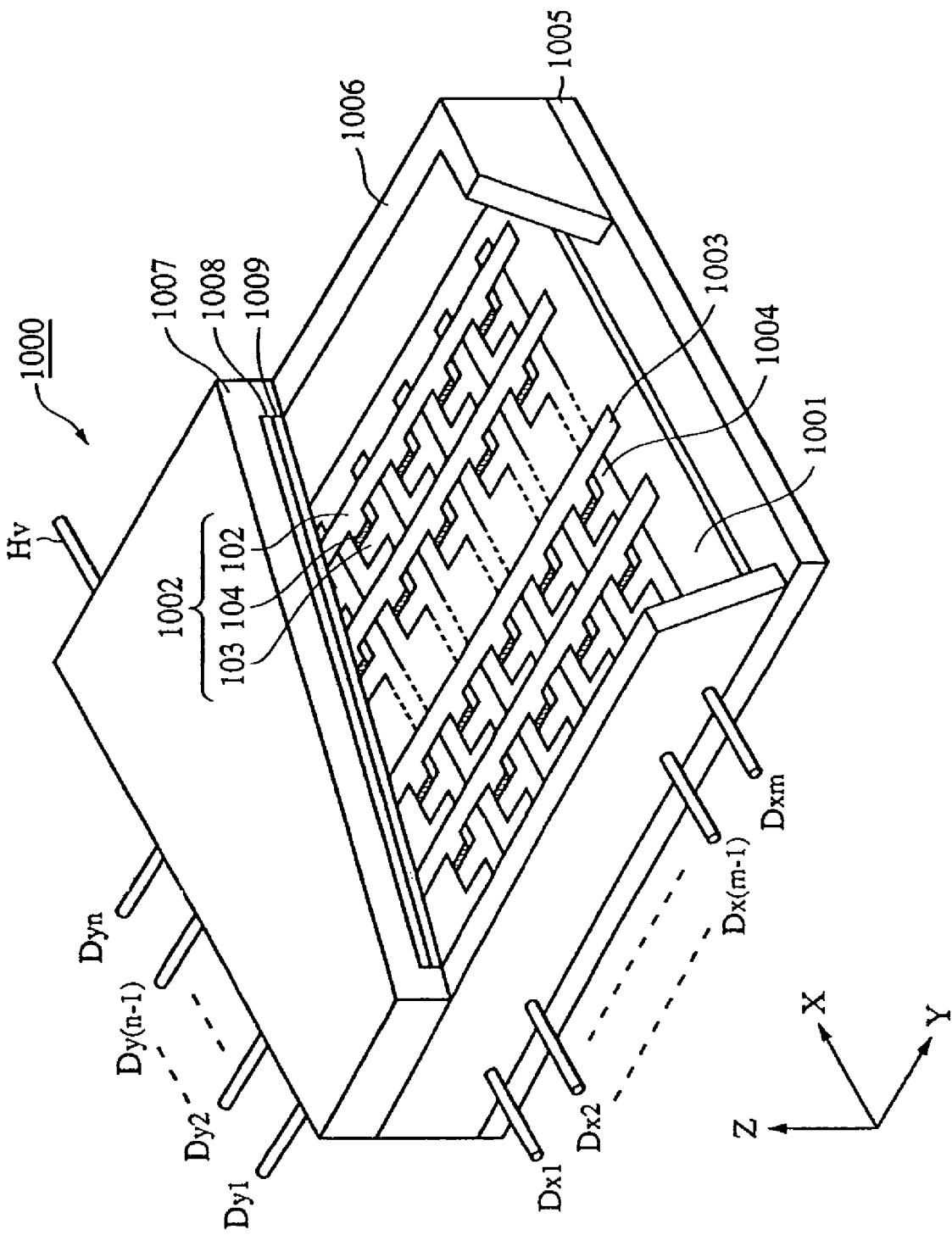
FIG. 9 is an isometric view of an image display device including the surface conduction electron emitter device of the present invention.

FIG. 9 is a partially broken isometric view of an image display device. The image display device 1000 includes a substrate 1001 and an electron source on the substrate 1001 with an insulating layer (not shown) therebetween. The electron source includes m column interconnections (X-line interconnections) 1004, n row interconnections (Y-line interconnections) 1003, electron emitting elements 1002, each of which includes a pair of element electrodes 102 and 103 and a thin film 104 functioning as an electron emitting portion. These electron emitting elements 1002 are arranged in a matrix and connect with the column and row interconnections. Each electron emitting element has a structure shown in FIG. 8.

In this electron source, insulating layers are formed at intersections of the X-line interconnections 1004 and the Y-line interconnections 1003 as in one of EXAMPLES 1 to 6.

Referring to FIGS. 8A, 8B, and 9, an ITO layer with a thickness of 100 nm was formed by a sputtering process on the glass substrate 1001 (PD200 made by Asahi Glass Company, softening point 830° C., annealing point: 620° C., strain point: 570° C.). The ITO layer was etched by a photolithographic process to form the element electrodes 102 and 103.

An Ag paste was applied onto the substrate by a screen printing process, and was fired to form the X-line interconnections 1004. Insulating layers were formed at intersections of the X-line interconnections 1004 and the Y-line interconnections 1003 (not yet formed) as in one of EXAMPLES 1 to 6. The Ag paste was applied onto the substrate by a screen printing process, and was fired to form the Y-line interconnections 1003. A matrix of interconnections was thereby formed on the substrate 1001.

An organic palladium solution was applied over each pair of element electrodes 102 and 103 by an inkjet process and was fired at 300° C. for 10 minutes to form a Pd conductive film 104 extending over the element electrodes 102 and 103.

Bipolar rectangular pulses of 14 V with a pulse width of 1 millisecond and pulse interval of 10 milliseconds were applied between the element electrodes 102 and 103 through the X-line and Y-line interconnections to form a gap in the conductive film 104 (FIGS. 8A and 8B). The electron source substrate was thereby prepared.

The substrate 1001, which was preliminarily bonded on a rear plate 1005 with frit glass, was bonded to a face plate 1007 using a 2 mm thick frame 1006 with frit glass at 400° C. The inner face of the rear plate 1005 had a phosphor layer 1008 and a metal back 1009. The phosphor layer was composed of striped R, G, and B color segments. An image display device was thereby assembled.

The interior of the image display device was evacuated by a vacuum pump through a vacuum line (not shown), and a nonvolatile getter (not shown) provided in the image display device was heated (activation of the getter) to enhance the degree of vacuum in the interior of the image display device. The vacuum line was sealed off by a gas burner.

A voltage of 14 V was applied to arbitrary selected electron emitting elements through the corresponding X-line and Y-line interconnections of the image display device while a voltage of 8 kV was being applied to the metal back from a high-voltage terminal 73. Bright clear images were formed for long time periods, when the insulating layers are formed according to any one of the above examples.

In this example, the electron emitting elements are disposed in regions that are not occupied by the matrix interconnections on a substrate, according to the method for forming patterned insulating elements on the substrate. Thus, the electron emitting elements constituting the electron source can be precisely arranged on the substrate and a clear image can be displayed on the image display device including the electron source.

According to the above method, patterned insulating elements can be formed at low cost, and the patterned insulating elements have reduced edge curl and no firing residue. Thus, a thick interconnection substrate having a high precision pattern can be readily formed. This method can be applied to a method for making an electron source including electron emitting elements arranged on a substrate and to a method for making an image display device including the electron source. According to these methods, the electron emitting elements can be precisely arranged on the substrate and a large planer image display device that can display high-precision images can be produced.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for forming patterned insulating elements on a substrate comprising:
    a first exposure step of exposing a first photosensitive paste provided on the substrate through a first mask having at least one opening area;
    a second exposure step of exposing a second photosensitive paste, having a lower softening point than that of the first photosensitive paste, provided on the first photosensitive paste through a second mask having at least one opening area which is larger than the at least one opening area of the first mask;
    a developing step of developing the first photosensitive paste and the second photosensitive paste to form a precursor pattern; and
    a firing step of firing the precursor pattern to form the patterned insulating elements.

2. A method for making an electron source including a substrate, a plurality of first interconnections on the substrate, a plurality of second interconnections above the first interconnections, the first interconnections and the second interconnections being separated by patterned insulating elements and being orthogonal to each other, and a plurality of electron emitting elements connected into a matrix by the first interconnections and the second interconnections, the method comprising:
    a first exposure step of exposing a first photosensitive paste provided on the substrate through a first mask having at least one opening area;
    a second exposure step of exposing a second photosensitive paste, having a lower softening point than that of the first photosensitive paste, provided on the first photosensitive paste through a second mask having at least one opening area which is larger than the at least one opening area of the first mask;
    a developing step of developing the first photosensitive paste and the second photosensitive paste to form a precursor pattern; and
    a firing step of firing the presursor pattern to form the patterned insulating elements.

* * * * *